United States Patent
Chan et al.

(10) Patent No.: US 7,069,461 B1
(45) Date of Patent: Jun. 27, 2006

(54) CLOSED-LOOP, SUPPLY-ADJUSTED RAM MEMORY CIRCUIT

(75) Inventors: Wai Cheong Chan, Sunnyvale, CA (US); James Thomas Doyle, Nederland, CO (US); Pavel Poplevine, Foster City, CA (US); Murali Krishna Varadarajula, Campbell, CA (US); Hsing-Chien Roy Liu, Cupertino, CA (US); Gordon Mortensen, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 552 days.

(21) Appl. No.: 10/351,056

(22) Filed: Jan. 24, 2003

(51) Int. Cl.
*G06F 1/04* (2006.01)

(52) U.S. Cl. .................. 713/501; 713/322; 713/600

(58) Field of Classification Search ................ 713/300, 713/320, 322, 323, 324, 500, 501, 600
See application file for complete search history.

(56) References Cited

U.S. PATENT DOCUMENTS

| | | | |
|---|---|---|---|
| 5,602,882 A | 2/1997 | Co et al. ..................... 375/372 |
| 6,262,611 B1 | 7/2001 | Takeuchi ..................... 327/159 |
| 6,317,008 B1 | 11/2001 | Gabara ................... 331/117 R |
| 6,351,165 B1 | 2/2002 | Gregorian et al. .......... 327/156 |
| 6,498,512 B1 | 12/2002 | Simon et al. ................. 326/93 |
| 6,633,987 B1 * | 10/2003 | Jain et al. .................... 713/300 |
| 6,720,808 B1 | 4/2004 | Chan .......................... 327/143 |
| 6,721,892 B1 * | 4/2004 | Osborn et al. .............. 713/300 |
| 6,889,331 B1 * | 5/2005 | Soerensen et al. .......... 713/320 |
| 2004/0199803 A1 * | 10/2004 | Suzuki et al. ................ 713/400 |

OTHER PUBLICATIONS

Dragan Maksimovic, Bruno Kranzen, Sandeep Dhar and Ravindra Ambatipudi, U.S. Appl. No. 10/053,226, filed Jan. 19, 2002, entitled "An Adaptive Voltage Scaling Digital Processing Component and Method of Operating the Same".
Bruno Kranzen and Dragan Maksimovic, U.S. Appl. No. 10/053,227, filed Jan. 19, 2002, entitled "Adaptive Voltage Scaling Clock Generator for Use in a Digital Processing Component and Method of Operating the Same".
Dragan Maksimovic and Sandeep Dhar, U.S. Appl. No. 10/053,828, filed Jan. 19, 2002, entitled "System for Adjusting a Power Supply Level of a Digital Processing Component and Method of Operating the Same".

(Continued)

*Primary Examiner*—Dennis M. Butler
(74) *Attorney, Agent, or Firm*—Mark C. Pickering

(57) ABSTRACT

The supply voltage of a memory system is adjusted in response to changes in the frequency of the clock signal. The memory system measures a time from when data becomes valid on the output of a memory to the next clock edge to determine a timing value. When the clock frequency changes from a first frequency to a second frequency, the timing value changes from a first value to a second value. The magnitude of the supply voltage is changed to return the timing value to the first value.

29 Claims, 9 Drawing Sheets

OTHER PUBLICATIONS

Dragan Maksimovic, Ravindra Ambatipudi, Sandeep Dhar and Bruno Krazen, U.S. Appl. No. 10/053,228, filed Jan. 19, 2002, entitled "An Adaptive Voltage Scaling Power Supply for Use in a Digital Processing Component and Method of Operating the Same".

James T. Doyle and Dragan Maksimovic, U.S. Appl. No. 10/160,428, filed Mar. 26, 2002, entitled "Method and System for Minimizing Power Consumption in Mobile Devices Using Cooperative Adaptive Voltage and Threshold Scaling".

Dragan Maksimovic and James Thomas Doyle, U.S. Appl. No. 10/166,822, filed Jun. 10, 2002, entitled "Serial Digital Communication Superimposed on a Digital Signal Over a Single Wire".

Dragan Maksimovic and Sandeep Dhar, U.S. Appl. No. 10/236,482, filed Sep. 6, 2002, entitled "Method and System for Providing Self-Calibration for Adaptively Adjusting a Power Supply Voltage in a Digital Processing System".

Dragan Maksimovic and Sandeep Dhar, U.S. Appl. No. 10/272,027, filed Oct. 15, 2002, entitled "All Digital Power Supply System and Method That Provides a Substantially Constant Supply Voltage Over Changes in PVT Without a Band Gap Reference Voltage".

Wai Cheong Chan and Donald Kevin Cameron, U.S. Appl. No. 10/324,997, filed Dec. 18, 2002, entitled "System and Method for Signal Delay in an Adaptive Voltage Scaling Slack Detector".

Mark F. Rives, U.S. Appl. No. 10/246,971, filed Sep. 19, 2002, entitled "Power Supply System and Method that Utilizes an Open Loop Power Supply Control".

Jim Doyle and Bill Broach, Small Gains in Power Efficiency Now, Bigger Gains Tomorrow [online]. Jul. 9, 2002 [retrieved on Feb. 1, 2003]. Retrieved from the Internet: <URL: http://www.commsdesign.com/design_corner/OEG20020709S0022>. pp. 1-5.

Robert W. Erickson and Dragan Maksimovic, *Fundamentals of Power Electronics*, Second Edition, Kluwer Academic Publishers, 2001, p. 333.

Krisztian Flautner, Steven Reinhardt and Trevor Mudge, Automatic Performance Setting for Dynamic Voltage Scaling, Wireless Networks, vol. 8, Issue 5, Sep. 2002, pp. 507-520, and Citation, pp. 1-3, [online]. [retrieved on Feb. 2, 2003]. Retrieved from the Internet: <URL: http://portal.acm.org/citation.cfm?id=582455.582463&coll=portal&dl=ACM&idx=J804&p . . . >.

Krisztian Flautner, Steven Reinhardt and Trevor Mudge, Automatic Performance Setting for Dynamic Voltage Scaling [online]. May 30, 2001, [retrieved on Feb. 2, 2003]. Retrieved from the Internet: <URL: http://www.eecs.umich.edu/~tnm/papers/mobicom01.pdf>. pp. 1-12.

Texas Instruments, "Synchronous-Buck PWM Controller With NMOS LDO Controller", TPS5110, SLVS025A- Apr. 2002, Revised Jun. 2002.

Intel XScale Core, Developer's Manual, Dec. 2000, [online], [retrieved on Feb. 2, 2002]. Retrieved from the Internet: <URL: http://developer.intel.com/design/intelxscale/27347301.pdf>. pp. 1-1 through B-1.

Kaushik Roy, Leakage Tolerant Circuits, Sub-Threshold Logic [online]. No date, [retrieved by inventor approximately Nov. 1, 2002]. Retrieved from the Internet:<URL:http://www.ece.purdue.edu/~visi/seven.pdf>. pp. 1-43.

Benjamin James Patella, "Implementation of a High Frequency, Low-Power Digital Pulse Width Modulation Controller Chip", Thesis Submitted to Graduate School of University of Colorado in Department of Electrical and Computer Engineering, 2000, pp. 1-272.

John G. Maneatis, "Low-Jitter Process-Independent DLL and PLL Based on Self-Biased Techniques", 1996 ISCCC 8.1 Presentation Slides, 3 sheets, IEEE Journal of Solid-State Circuits, vol. 31, No. 11, Nov. 1996, pp. 1723-1732.

U.S. Appl. No. 10/053,858, filed Jan. 19, 2002, Maksimovic et al.

U.S. Appl. No. 10/106,428, filed Mar. 26, 2002, Doyle et al.

U.S. Appl. No 10/272,027, filed Oct. 15, 2002, Doyle et al.

\* cited by examiner

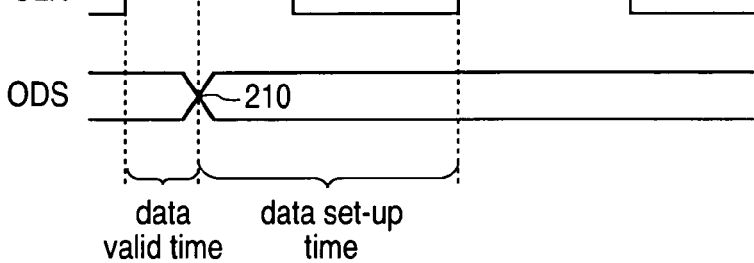
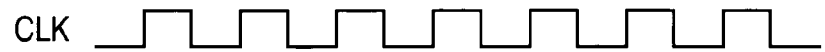
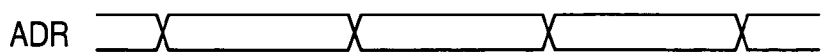
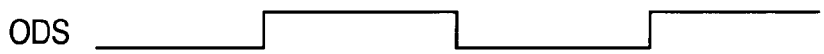
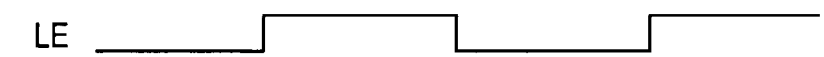
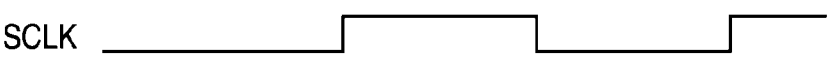
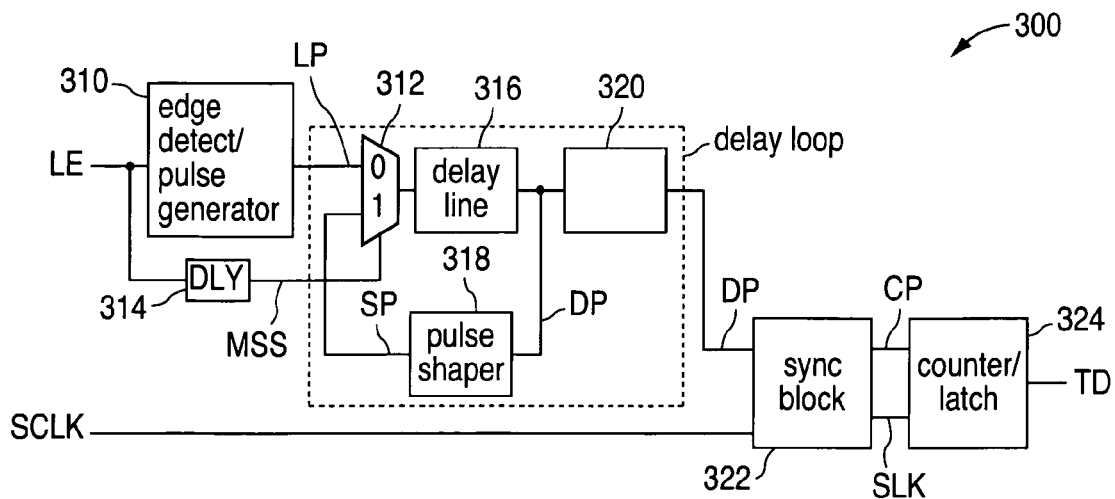
FIG. 3

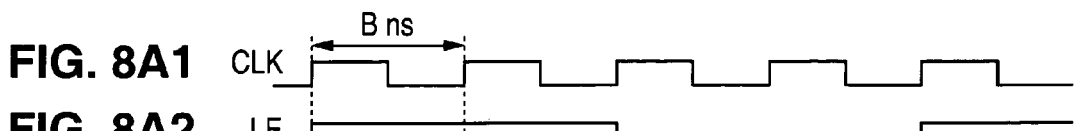
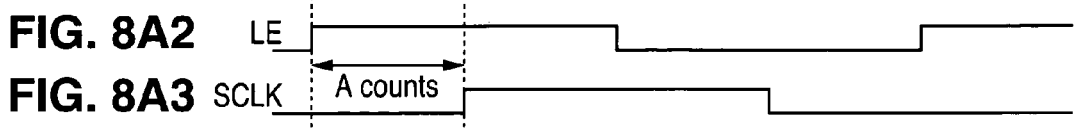
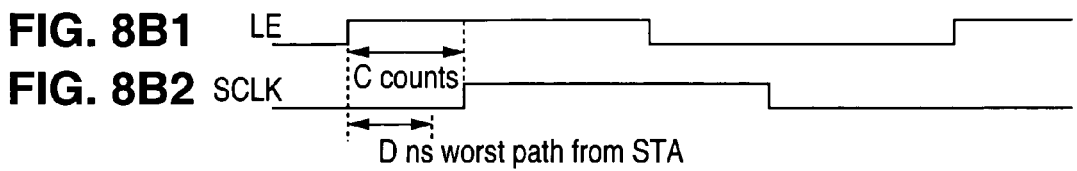
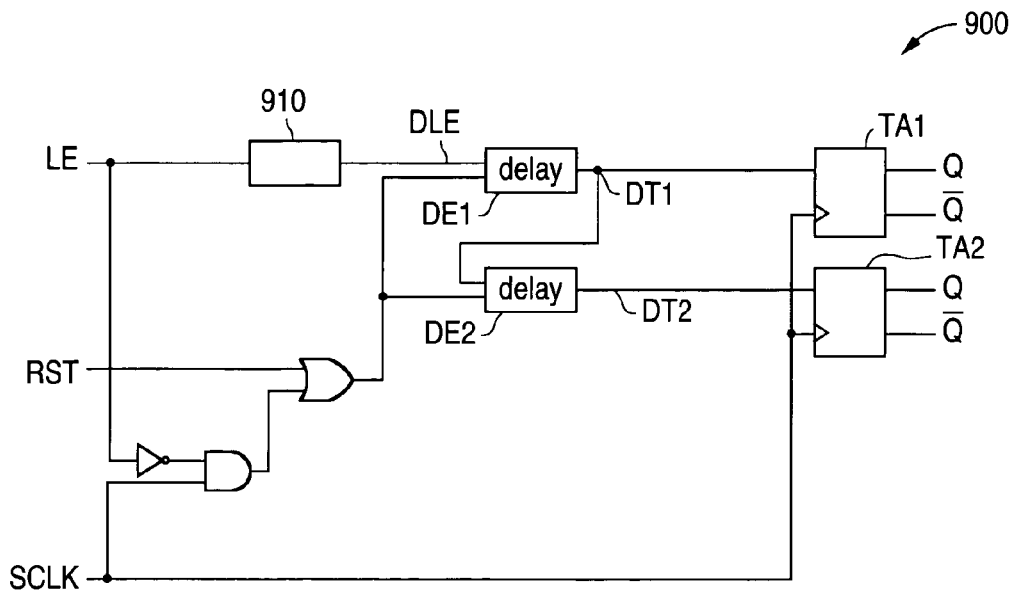
FIG. 9A
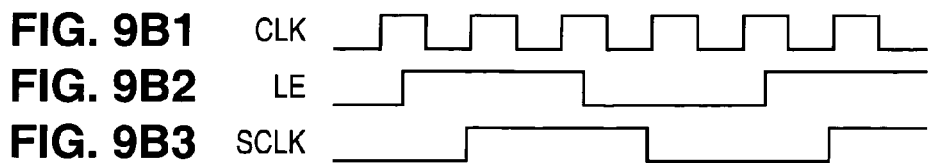

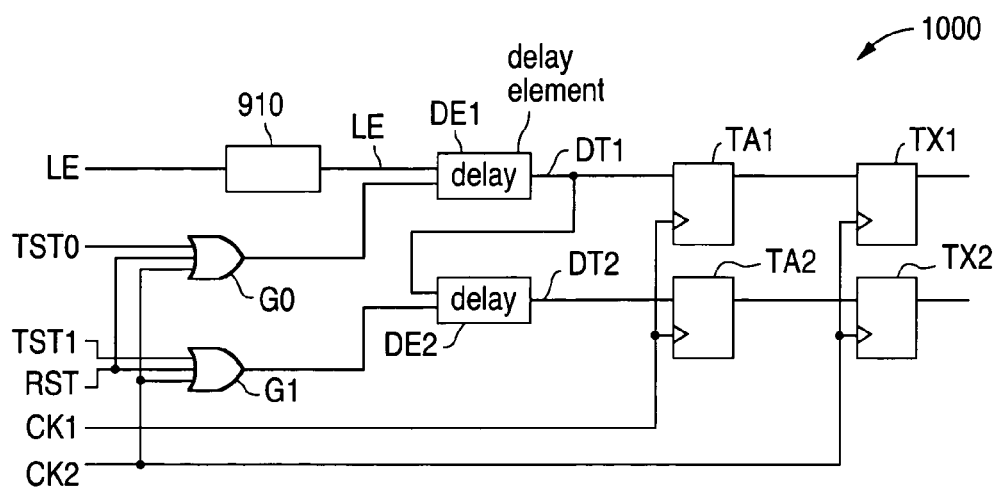
FIG. 10A
FIG. 10B1 CLK 
FIG. 10B2 LE 
FIG. 10B3 CK1 
FIG. 10B4 CK2 

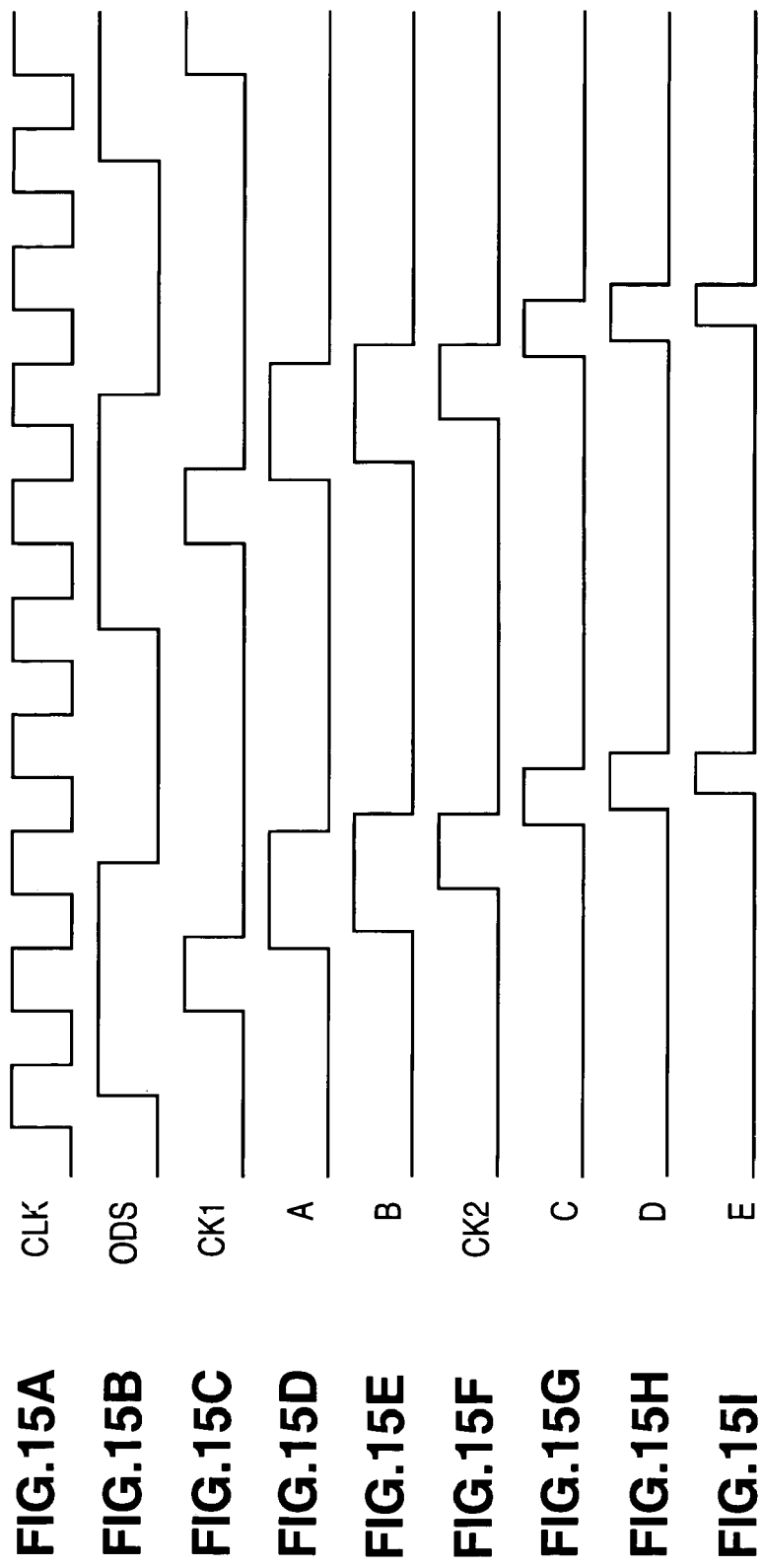

CLOSED-LOOP, SUPPLY-ADJUSTED RAM MEMORY CIRCUIT

RELATED APPLICATION

The present invention is related to application Ser. No. 10/351,061 for "Closed-Loop, Supply-Adjusted ROM Memory Circuit" by Wai Chan et al. filed on an even date herewith.

BRIEF DESCRIPTION OF THE DRAWINGS

FIGS. 2A1–2A2 are timing diagrams illustrating an example of the timing of RAM 110 in accordance with the present invention.

FIGS. 2B1–2B5 are timing diagrams illustrating the timing relationship of the various signals during normal operation in accordance with the present invention.

FIG. 3 is a block diagram illustrating an example of a time slack detector 300 in accordance with the present invention.

FIGS. 8A1–8A3 and 8B1–8B2 are timing diagrams illustrating the removal of slack in accordance with the present invention.

FIG. 9A is a schematic diagram illustrating a first alternate embodiment of a time slack detector 900 in accordance with the present invention. FIGS. 9B1–9B3 are timing diagrams illustrating the operation of detector 900 in accordance with the present invention.

FIG. 10A is a schematic diagram illustrating a time slack detector 1000 in accordance with a second alternate embodiment of the present invention. FIGS. 10B1–10B4 are timing diagrams illustrating the operation of detector 1000 in accordance with the present invention.

FIGS. 13A–13G are timing diagrams illustrating the test operation of detectors 1000 and 1200 in accordance with the present invention.

FIGS. 15A–15I are timing diagrams illustrating the operation of timing generation circuit 1400 in accordance with the present invention.

DETAILED DESCRIPTION OF THE INVENTION

Figure 1A:
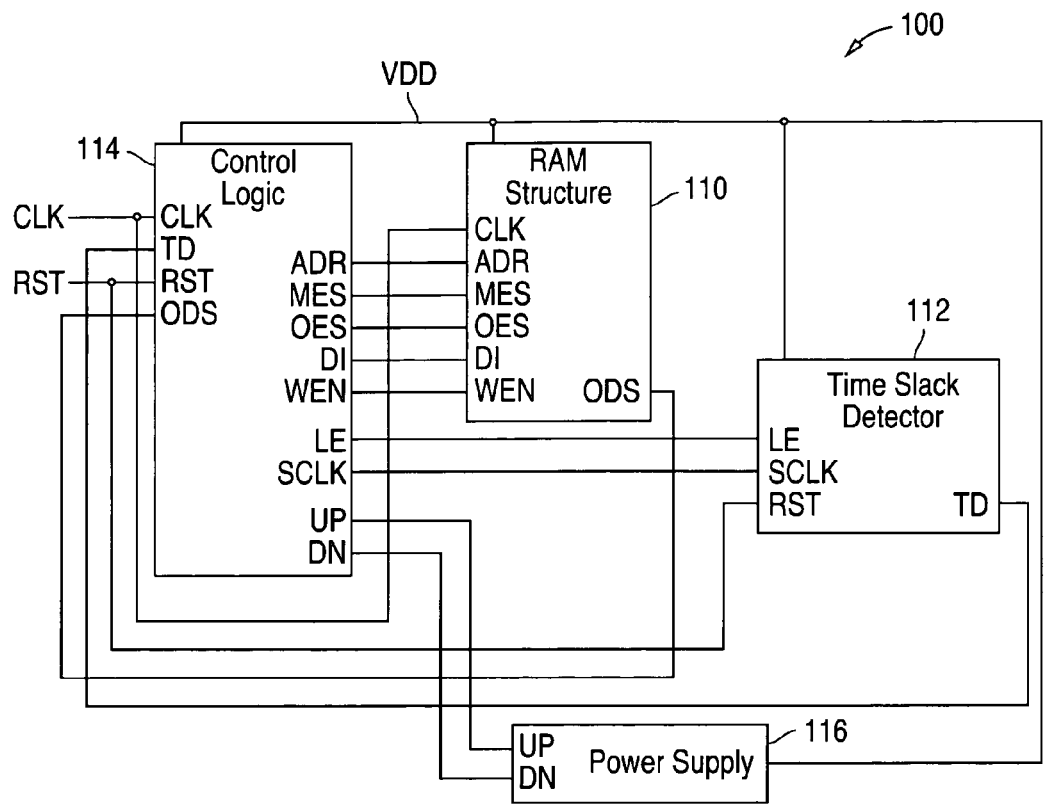
FIG. 1A is a block diagram illustrating an example of a closed-loop, supply-adjusted memory circuit 100 in accordance with the present invention.

FIG. 1A shows a block diagram that illustrates an example of a closed-loop, supply-adjusted memory circuit 100 in accordance with the present invention. As described in greater detail below, circuit 100 utilizes a replica memory to adjust the supply voltage applied to a memory system when different clock frequencies are used. By adjusting the supply voltage when different clock frequencies are used, the power consumption of the memory system can be reduced.

As shown in FIG. 1A, circuit 100 includes a random-access-memory (RAM) 110 that has a control circuit and a number of memory cells that are arranged in rows and columns. The control circuit of RAM 110 is connected to receive an address signal ADR, and to an external clock circuit to receive a clock signal CLK. The address signal ADR identifies the to-be-read memory cells, while the clock signal CLK begins a memory read operation when RAM 110 is enabled.

The control circuit is also connected to receive a data in signal DI and a write enable signal WEN. The data in signal DI represents the data to be written to RAM 110 when the write enable signal WEN is enabled. The control circuit is further connected to receive a memory enable signal MEN, and an output enable input OES.

The control circuit of RAM 110 also generates an output data signal ODS that represents the logic states of the memory cells, identified by the address signal ADR, that have been read. The output data signal ODS is output to other circuits that have data timing requirements. RAM 110 can be implemented with, for example, an array of static random-access-memory (SRAM) cells, a row of flip-flops, such as D-Q flip flops, that implement a register file, or other similar memory structures.

FIGS. 2A1–2A2 show timing diagrams that illustrate an example of the timing of RAM 110 in accordance with the present invention. As shown in FIGS. 2A1–2A2, in response to the rising edge of a clock signal CLK, RAM 110 requires a period of time, known as a data valid time, to read an identified memory cell and generate the output data signal ODS with a logic state that represents the logic state of the identified memory cell.

Thus, the data valid time extends from the rising edge of the clock signal CLK to a logic transition point 210 of the output data signal ODS which, in turn, indicates that the data is now valid. In addition to the data valid time, a data set up time extends from the logic transition point 210 of the output data signal ODS to the next rising edge of the clock signal CLK.

In a synchronous logic system, the maximum propagation delay between two sequential clocked logic devices is one clock cycle. In the present example, a portion of the one clock cycle is consumed by the data valid time. As a result, the output data signal ODS can take no longer than the data set up time to pass through any non-clocked logic before reaching the next clocked logic device.

The relative timing of logic transition point 210 with respect to the clock signal CLK is a function of the magnitude of the supply voltage VDD provided to RAM 110. For example, if a lower voltage is provided to RAM 110, logic transition point 210 shifts right with respect to the clock signal CLK, thereby leaving less data set up time for the output data signal ODS to reach the next clocked logic device.

RAM 110 represents the worst case data valid time of the different memory modules that are used in a system such that when sufficient supply voltage is provided to RAM 110 to meet the timing requirements, the remaining memory modules also meet the timing requirements.

Returning to FIG. 1A, circuit 100 also includes a time slack detector 112 that insures that the supply voltage VDD applied to RAM 110 (and the associated logic) is sufficient to meet the timing requirements. Detector 112 is connected to receive a launch signal LE and a sample signal SCLK.

FIGS. 2B1–2B5 show timing diagrams that illustrate an example of the timing relationship among the signals during normal operation in accordance with the present invention. As shown in FIGS. 2B1–2B5, the launch signal LE is four times slower than the clock signal CLK. Further, the rising edge of the launch signal LE represents a change of state point in the output data signal ODS where data can change from one logic state to another logic state (logic transition point 210) during normal operation. In addition, the sample signal SCLK is also four times slower than the clock signal CLK, and the falling edge of the sample signal SCLK occurs on the rising edge of the clock signal CLK after the falling edge of the launch signal LE has occurred.

In addition to the above, detector 112 receives a reset signal RST from an external reset circuit, and outputs timing data TD that indicates whether the supply voltage VDD needs to be adjusted. In one embodiment, the timing data can be a count value, while in another embodiment the timing data can be a multi-bit word.

FIG. 3 shows a block diagram that illustrates an example of a time slack detector 300 in accordance with the present invention. As shown in FIG. 3, time slack detector 300 includes an edge detect/pulse generator 310 that detects the rising edge of the launch signal LE, and generates a launch pulse LP in response to the detection.

Figure 4:
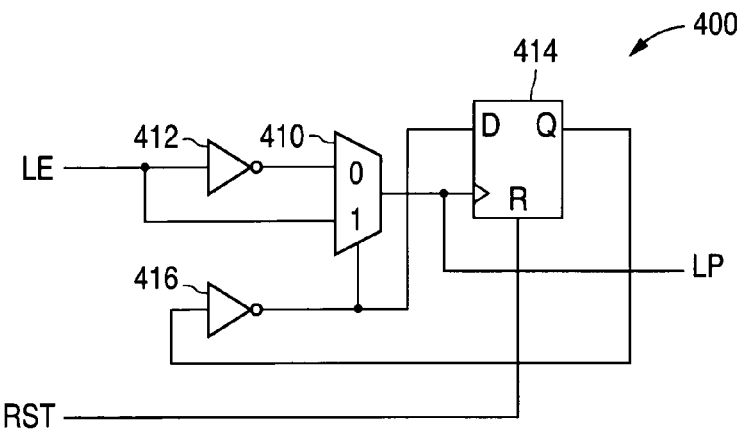
FIG. 4 is a circuit diagram illustrating an example of an edge detect/pulse generator 400 in accordance with the present invention.

FIG. 4 shows a circuit diagram that illustrates an example of an edge detect/pulse generator 400 in accordance with the present invention. As shown in FIG. 4, generator 400 includes a multiplexer 410 that has a first input connected to receive the launch signal LE via an inverter 412, and a second input directly connected to receive the launch signal LE. In addition, multiplexer 410 has an output that generates the launch pulse LP, and a select input that defines whether the first or second input is connected to the output.

Generator 400 further includes a D-Q flip flop 414 that has a D input, a clock input connected to the output of multiplexer 410, and a Q output. The Q output is connected to the input of an inverter 416, while the output of inverter 416 is connected to the select input of multiplexer 410 and the D input of flop 414. Further, the reset signal RST is input to a clear input of flop 414.

In operation, flop 414 outputs a logic low from the Q output following a reset which, via inverter 416, places a logic high on the select input of multiplexer 410 and the D input of flop 414. In this example, assume that the logic high on the select input selects the second input of multiplexer 410.

Thus, when the rising edge of the launch signal LE occurs, the edge is passed through multiplexer 410 as the rising edge of the launch pulse LP. In addition, the rising edge also clocks flop 414, thereby causing the Q output to rise to a logic high. This places a logic low on the select input of multiplexer 410 and the D input of flop 414. The logic low on the select input causes mux 410 to now pass the logic low on the first input of multiplexer 410 as the falling edge of the launch pulse LP.

When the falling edge of the launch signal LE occurs, inverter 412 outputs a rising edge which is passed through multiplexer 410 as the next rising edge of the launch pulse LP. In addition, the rising edge clocks flop 414, thereby causing the Q output to again fall to a logic low. This again places a logic high on the select input of multiplexer 410 and the D input of flop 414. The logic high on the select input causes mux 410 to now pass the logic low on the second input of multiplexer 410 as the falling edge of the launch pulse LP.

Referring again to FIG. 3, time slack detector 300 also includes a multiplexer 312 that has a first input connected to generator 310 to receive the launch pulse LP, a second input, and an output. In addition, detector 300 includes a mux selector 314 that generates a mux select signal MSS that is output to multiplexer 312.

Selector 314, which can be implemented as a delay, sets the logic state of the mux select signal MSS to a first logic state a predetermined time after the launch signal LE transitions from a logic high to a logic low, and sets the logic state to a second logic state the predetermined time after the launch signal LE transitions from a logic low to a logic high.

Figure 5A:
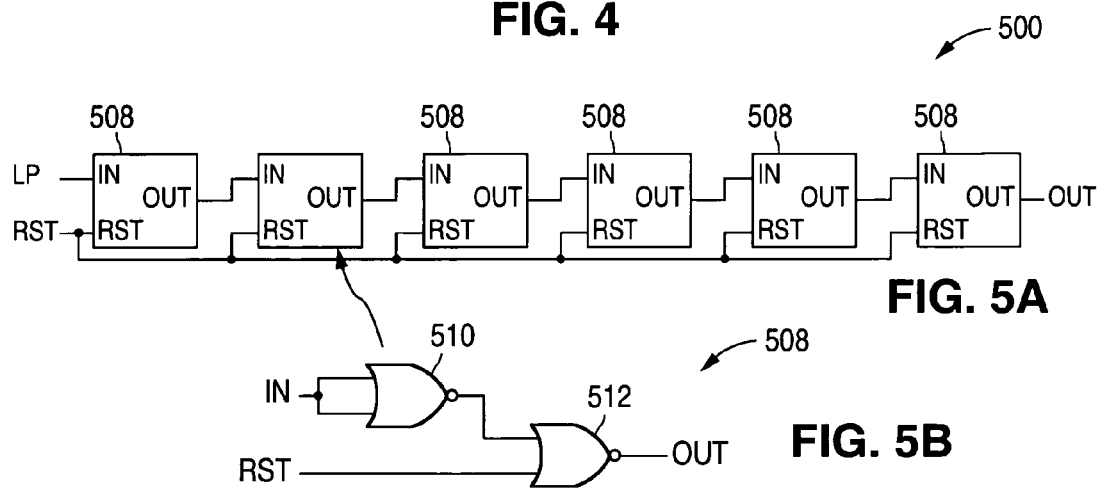
FIG. 5A is a schematic diagram illustrating an example of a delay element 500 in accordance with the present invention.

Time slack detector 300 further includes a delay element 316 that delays pulses passed by multiplexer 312 to generate delayed pulses DP. Delay element 316 includes a number of serially-connected delay cells that provide a timing delay. FIG. 5A shows a schematic diagram that illustrates an example of a delay element 500 in accordance with the present invention. As shown in FIG. 5A, delay element 500 includes a number of serially-connected delay cells 508.

Figure 5B:
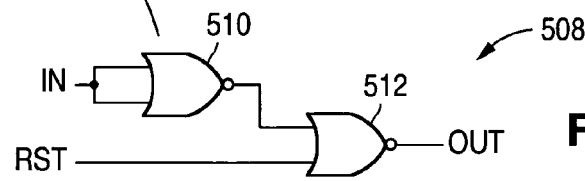
FIG. 5B is a schematic diagram illustrating an example of a delay cell 508 in accordance with the present invention.

FIG. 5B shows a schematic diagram that illustrates an example of delay cell 508 in accordance with the present invention. As shown in the FIG. 5B example, delay cell 508 includes a first NOR gate 510 and a second NOR gate 512. First gate 510 has first and second inputs that are connected together and an output, while second gate 512 has a first input connected to the output of gate 510, and a second input connected to receive a reset signal RST. The reset signal input to cells 508 can be generated, for example, by ORing the reset signal RST and the sample signal SCLK.

Returning again to FIG. 3, time slack detector 300 also includes a pulse shaper 318 that shapes the delayed pulses DP to form shaped pulses SP, and outputs the shaped pulses SP to the second input of multiplexer 312.

In operation, when the rising edge of the launch signal LE occurs, multiplexer 312 passes the launch pulse LP generated by generator 310 to delay element 316 which outputs a delayed pulse DP. The delayed pulse DP is shaped and fed back as the shaped pulse SP to multiplexer 312.

After a delay provided by selector 314, multiplexer 312 switches to pass the signal on the second input, and thereby passes the shaped pulse SP to delay element 316. As a result of selecting the second input, multiplexer 312 blocks the launch pulse LP on the first input that results from the falling edge of the launch signal LE.

Delay element 316 delays the shaped pulse SP to form another delayed pulse DP which is again fed back via shaper 318. Thus, each time a rising edge of the launch signal LE is detected, delay element 316 outputs a series of delayed pulses DP with a pulse to pulse delay substantially defined by the delay of delay element 316.

As further shown in FIG. 3, time slack detector 300 includes a buffer 320 that buffers the delayed pulses DP, and a synchronization block 322 that is connected to receive the buffered delayed pulses DP and the sample signal SCLK. Synchronization block 322 includes a synchronization circuit that synchronizes the delayed pulses DP and the sample signal SCLK to output a sample clock signal SLK, and a delay circuit that delays the delayed pulses DP to compensate for the delay introduced by the synchronization circuit to form counter pulses CP.

Figure 6:
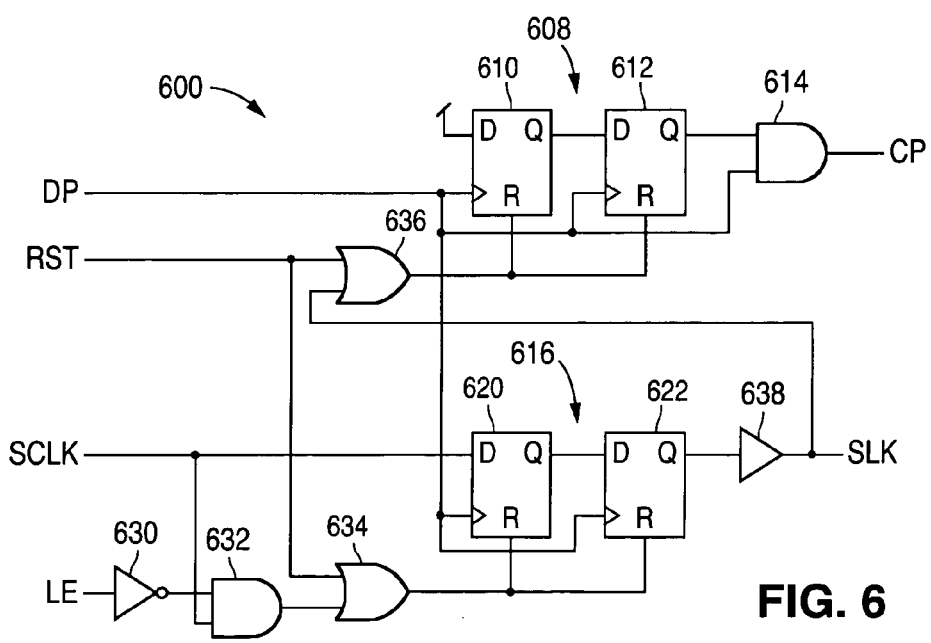
FIG. 6 is a schematic diagram illustrating an example of a synchronization block 600 in accordance with the present invention.

FIG. 6 shows a schematic diagram that illustrates an example of a synchronization block 600 in accordance with the present invention. As shown in FIG. 6, block 600 includes a delay circuit 608 that has first and second D-Q flip flops 610 and 612, and an AND gate 614. The D input of flop 610 is connected to a logic high, while the D input of flop 612 is connected to the Q output of flop 610.

In addition, an input of AND gate 614 is connected to the Q output of flop 612. Further, flops 610 and 612 are clocked by the delayed pulses DP, which also form an input to AND gate 614. In operation, delay circuit 608 generates counter pulses CP by delaying the delayed pulses DP by two clock cycles.

As further shown in FIG. 6, the two clock delay compensates for a two clock delay introduced by a synchronization circuit 616 that has third and fourth D-Q flip flops 620 and 622. The D input of flop 620 is connected to receive the sample signal SCLK, while the D input of flop 622 is connected to the Q output of flop 620. Flops 620 and 622 are also clocked by the delayed pulses DP.

Thus, flop 620 of synchronization circuit 616 latches a logic high only if the sample signal SCLK is high when the rising edge of a delayed pulse DP occurs. As a result, synchronization block 600 outputs counter pulses CP and a sample clock signal SLK that are synchronized.

Circuit 600 also includes an inverter gate 630, an AND gate 632, an OR gate 634, and an OR gate 636. Gates 630, 632, and 634 are used to reset flops 620 and 622 after a sample clock edge has been generated, while gate 636 is used to reset flops 610 and 612. Circuit 600 further includes a buffer 638 that buffers the sample clock signal SLK.

Referring again to FIG. 3, detector 300 additionally includes an n-bit counter 324 that counts each counter pulse CP to form a count, and latches and outputs the count in response to the rising edge of the sample clock signal SLK. For example, the first forty delay pulses DP output by delay element 316 can be counted by counter 324 (as counter pulses CP) before the rising edge of the sample clock signal SLK occurs.

Figure 7:
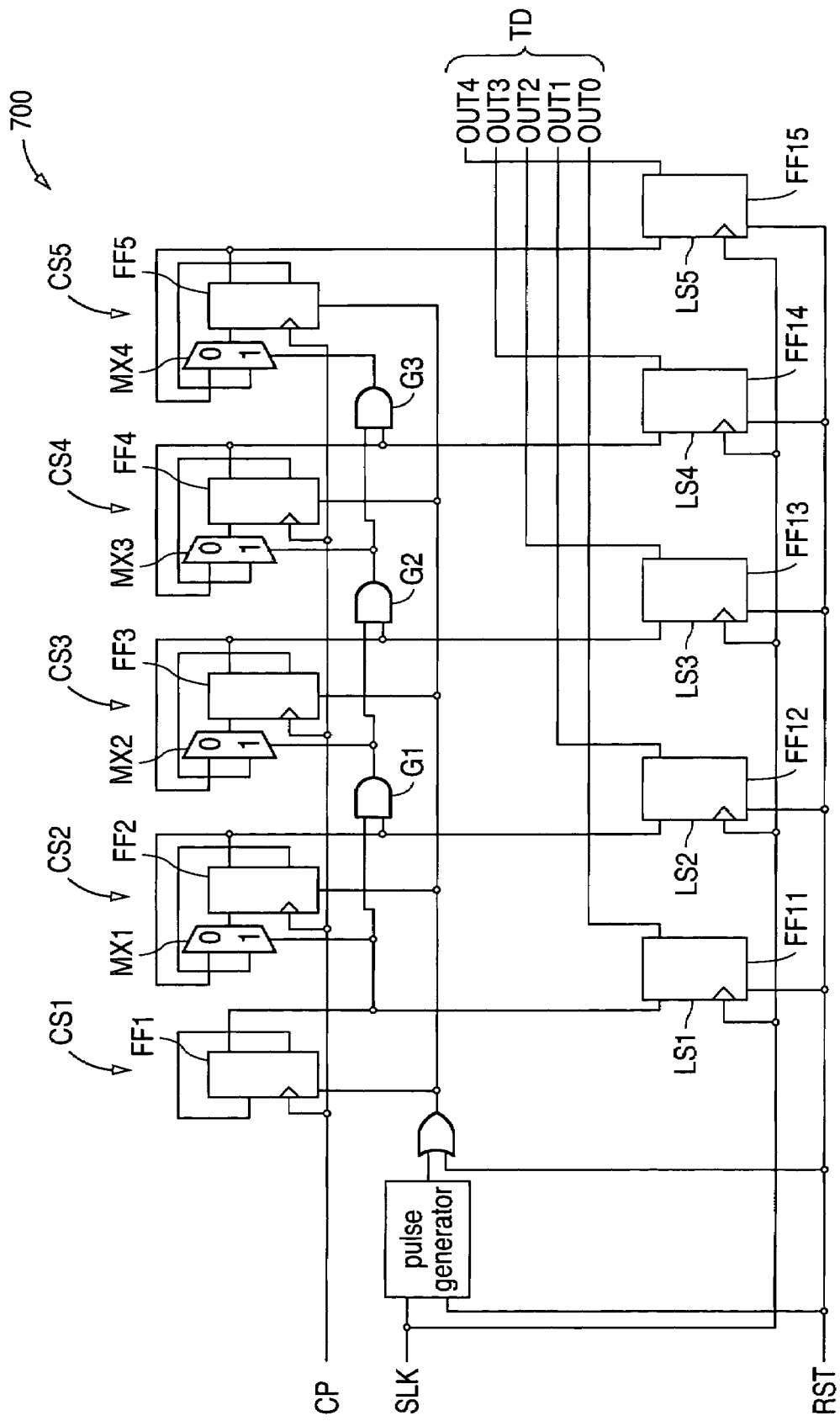
FIG. 7 is a schematic diagram illustrating an example of a counter 700 in accordance with the present invention.

FIG. 7 shows a schematic diagram that illustrates an example of a counter 700 in accordance with the present invention. As shown in FIG. 7, counter 700 includes five counting stages CS1–CS5 and five latch stages LS1–LS5 that latch the value of a corresponding counting stage CS in response to the rising edge of the sample clock signal SLK. (Different numbers of counting stages CS and latch stages LS can alternately be used, e.g., six counting and latch stages can be used.)

Counting stages CS1–CS5 include a series of D-Q flip flop FF1–FF5, while counting stages CS2–CS5 include a series of multiplexers MX1–MX4 with an output that is connected to the D input of the corresponding flop FF2–FF5, e.g., the output of multiplexer MX1 is connected to the D input of flop FF2, and the output of multiplexer MX2 is connected to the D input of flop FF3.

Each multiplexer MX1–MX4 also has a pair of inputs that are connected to the Q and Qbar outputs of the corresponding flop FF, e.g., the Q and Qbar outputs of flop FF2 are connected to the inputs of mux MX1, while the Q and Qbar outputs of flop FF3 are connected to the inputs of mux MX2. When the select signal is a logic low, the Q output is passed, and when the select signal is a logic high, the Q bar output is passed.

In addition, counting stages CS3–CS5 each include an AND gate G1–G3 with an output that is connected to the select input of the corresponding multiplexer, e.g., the output of AND gate G1 is connected to the select input of mux MX2, and the output of AND gate G2 is connected to the select input of mux MX3.

AND gate G1 has inputs connected to the Q outputs of flops FF1 and FF2, while gate G2 has an input connected to the Q output of flop FF3 and an input connected to the output of gate G1. In addition, AND gate G3 has an input connected to the Q output of flop FF4 and an input connected to the output of gate G2. In addition, a pulse generator and NOR gate are used to generate signals that reset flops FF1–FF5 and FF11–FF15.

Latch stages LS1–LS5 each include a D-Q flip flop FF11–FF15 with a clock input connected to receive the sample clock signal SLK, and a D input connected to the Q output of the flop of the corresponding counting stage, e.g., the output of flop FF1 is connected to the D input of flop FF11, while the output of flop FF2 is connected to the D input of flop FF12. The outputs of flops FF11–FF15 define the count.

In operation, following a reset, the D outputs of flops FF1–FF5 and FF11 and FF15 are a logic zero. The logic high on the Qbar output of FF1 is fed back to the D input, while the logic zero on the Q output of flop FF1 selects the Q output of flop FF2 which, in turn, passes the logic zero to the D input of flop FF2. In addition, each of the AND gates G1–G3 output a logic zero to the select inputs of muxes MX2–MX4 which, in turn, passes the logic zero to the D input of flops FF3–FF5.

In response to the first counter pulse, the Q output of flop FF1 outputs a logic high, while the Q outputs of flops FF2–FF5 continue to output logic zeros. The logic high output by flop FF1 selects the Qbar output of flop FF2 which, in turn, passes a logic high to the D input of flop FF2.

In response to the second counter pulse, the Q output of flop FF1 outputs a logic low, the Q output of flop FF2 outputs a logic high, while the Q outputs of flops FF3–FF5 continue to output logic zeros. The logic low output by flop FF1 selects the Q output of flop FF2 which, in turn, passes a logic high to the D input of flop FF2.

In response to the third counter pulse, the Q output of flop FF1 outputs a logic high, the Q output of flop FF2 outputs a logic high, while the Q outputs of flops FF3–FF5 continue to output logic zeros. The logic high output by flop FF1 selects the Qbar output of flop FF2 which, in turn, passes a logic low to the D input of flop FF2. In addition, the logic highs on the Q outputs of both flops FF1 and FF2 causes multiplexer MX2 to select the Qbar output of flop FF3 which, in turn, passes a logic high to the D input of flop FF3.

In response to the fourth counter pulse, the Q output of flop FF1 outputs a logic low, the Q output of flop FF2 outputs a logic low, the Q output of flop FF3 outputs a logic high, while the Q outputs of flops FF4–FF5 continue to output logic zeros. The counting process continues until the rising edge of the sample clock signal SLK clocks in the current count output by flops FF1–FF5. In addition to the counter described in FIG. 7, other types of counters can alternately be used. For example, a ripple counter can be used in lieu of counter 700.

Returning to FIG. 1A, circuit 100 additionally includes a control circuit 114 and a power supply 116. Control circuit 114 varies the magnitude of the supply voltage VDD output by power supply 116 via up and down signals UP and DN, respectively, in response to the timing data TD (e.g., the latched count) output by time slack detector 112. For example, the up signal UP can be used by power supply 116 to increase a reference voltage, while the down signal DN can be used to decrease the reference voltage.

In operation, control circuit 114 insures the data integrity of the data stored in RAM 110. In the present invention, RAM 110 is part of a memory system, and a model of the worst case RAM used in the memory system. RAM 110 is separate from the available RAMs that are used by the memory system.

Figure 1B:
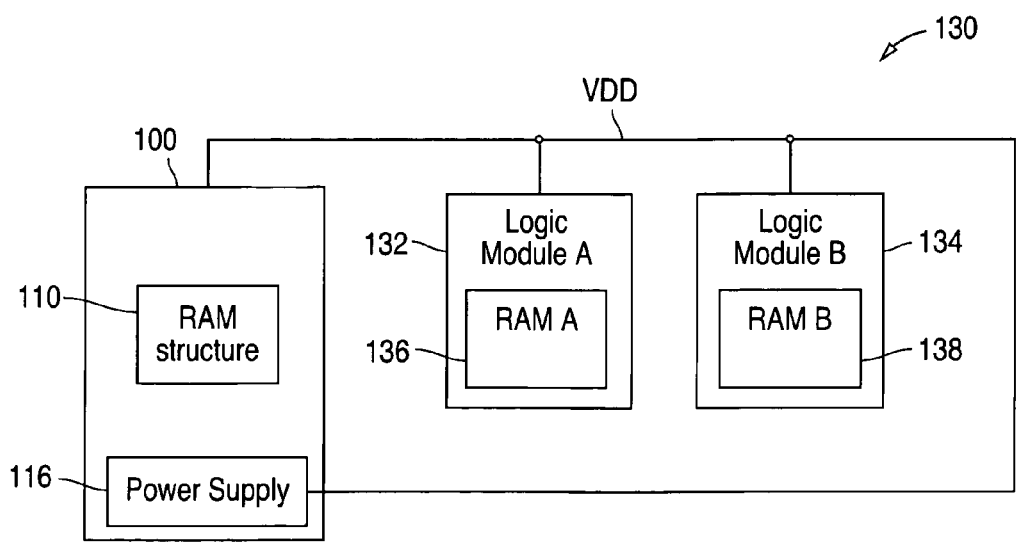
FIG. 1B is a block diagram illustrating a memory system 130 in accordance with the present invention.

FIG. 1B shows a block diagram that illustrates a memory system 130 in accordance with the present invention. As shown in FIG. 1B, memory system 130 includes memory circuit 100, a first logic module 132, and a second logic module 134. First logic module 132 includes a RAM 136, while second logic module 134 includes a RAM 138. (Additional logic modules and RAMs can be utilized. Further, the RAMs can have different sizes.) In addition, logic modules 132 and 134 (including RAMs 136 and 138) are connected to receive the supply voltage VDD generated by power supply 116.

In the present invention, RAM 110 models the RAM, such as RAM 136 or 138 that provides the worst case performance (slowest operation at a given voltage and temperature). Thus, RAM 110 has a performance that is equal to or worse than the performance of RAMs 136 and 138.

In this example, RAM 110 does not store program data or instructions, but stores only test data that is read back to insure data integrity. The test data can be written to RAM 110 as a series of alternating ones and zeros so that when sequential addresses ADR are input to RAM 110, an alternating series of ones and zeros is output by RAM 110.

Thus, to insure data integrity, circuit 114 outputs sequential address signals ADR and alternating ones and zeros (along with the memory enable signal ME and the output enable signal OE) to RAM 110. For example, a zero is written to memory location 0, a one is written to memory location 1, and a zero is written to memory location 2.

In response, RAM 110 generates the output data signal ODS that represents the data read from RAM 110 at the addresses identified by the address signals ADR. In this example, RAM 110 outputs a logic zero followed by a logic one and a logic zero.

Control circuit 114 reads the data from RAM 110 via the output data signal ODS, and compares the data read from RAM 110 with the data that is known to have been written to RAM 110. If the data read from RAM 110 does not match the data known to have been written to RAM 110, then control circuit 114 increases the supply voltage VDD via the up signal UP regardless of the value of the timing data TD.

Control circuit 114 continues to incrementally increase the supply voltage VDD until the data read from RAM 110 matches the data known to have been written to RAM 110, or the supply voltage VDD reaches a predetermined upper limit in which case the RAM is marked, such as by a flag, as damaged.

On the other hand, if the data read from RAM 110 matches the data known to have been written to RAM 110, and the value of the timing data TD is more than a target value, then a complementary pattern of zeros and ones is written into RAM 110. For example, a one is written to memory location 0, a zero is written to memory location 1, and a one is written to memory location 2.

Control circuit 114 again reads the data from RAM 110 via the output data signal ODS, and compares the data read from RAM 110 with the data that is known to have been written to RAM 110. If the data read from RAM 110 does not match the data known to have been written to RAM 110, then control circuit 114 increases the supply voltage VDD via the up signal UP regardless of the value of the timing data TD.

Control circuit 114 continues to incrementally increase the supply voltage VDD until the data read from RAM 110 matches the data known to have been written to RAM 110, or the supply voltage VDD reaches a predetermined upper limit in which case the RAM is marked as damaged.

On the other hand, if the data read from RAM 110 matches the data known to have been written to RAM 110, and the value of the timing data TD is more than a target value, then lower supply voltages can be used with RAM 110. (RAM 110 has a minimum supply voltage, e.g. 0.7V in a 1.2V system.) This process can be continuously performed in the background, or wait states can be added if continuous checking is not needed or desired.

In addition to verifying data integrity, control circuit 114 also controls the magnitude of the supply voltage in response to the frequency of the clock signal by responding to the timing data TD output by time slack detector 112. As noted above, time slack detector 112 detects the rising edge of the launch signal LE which causes counter pulses CP to be generated and counted by the counter in detector 112. The next rising edge of the sample signal SCLK, after being synchronized to form the sample clock signal SLK, is used to latch and output the count to control circuit 114. As a result, the data set up time is measured by the count value.

Memory circuit 100 is calibrated using the worst case process, voltage, and temperature (PVT) conditions (slowest corner, nominal voltage, and highest temperature) when the clock signal has the highest frequency used by the application. Under these conditions, the count is measured.

When the frequency of the clock signal CLK is lowered, the change in frequency is reflected in the count. For example, if a 50 MHz clock signal generates a count of 40, a 25 MHz clock signal will generate a count of 80. (A count of 40 requires at least a six-bit counter, while a count of 80 requires a larger counter. However, the counter need not be capable of counting twice as high (80) as the reference value (40 in this example) because a count higher than the reference value indicates that the supply voltage VDD can be reduced. Thus, as long as the counter can support the reference count, it does not matter if the counter hits the maximum count when the frequency of the clock signal CLK changes.) Control circuit 114 responds to the increased count value and outputs the down signal DN to lower the supply voltage VDD.

As the supply voltage VDD is lowered, the count falls. The supply voltage VDD is incrementally lowered until the count again reaches 40, assuming that data integrity can be maintained at the lower supply voltage. (Similarly, control circuit 114 outputs the up signal UP to raise the supply voltage VDD when the clock frequency is again increased.) Thus, the present invention provides a circuit and a method of reducing the supply voltage when the frequency of the clock signal decreases (and increasing the supply voltage when the frequency of the clock signal again increases), thereby reducing the power consumed by memory circuit 100.

RAM 110 is a replica memory that is used to change the supply voltage applied to circuit 100 as well as to the other modules of the memory system (in response to changes in the clock frequency). Since RAM 110 represents the worst case condition, the supply voltage applied to RAM 110 can also be applied to the other modules of the memory system, thereby reducing the power consumption of the memory system.

In addition to controlling the magnitude of the supply voltage VDD in response to the frequency of the clock signal, the present invention can also further lower the supply voltage by squeezing out any slack in the timing.

FIGS. 8A1–8A3 and 8B1–8B2 are timing diagrams that illustrate the removal of slack in accordance with the present invention. To squeeze out the slack, control circuit 114 first determines the count that should get latched (the target value) if the slack is removed, and then varies the supply voltage VDD via the up and down signals UP and DN until the determined count is latched.

To determine the target value, control circuit 114 first enters a calibration mode to determine a timing per count TPC. To determine the timing per count TPC, circuit 114 synchronizes the launch signal LE to the clock signal CLK which, in turn, is set to the highest frequency provided by the application. In addition, worst case voltage and temperature conditions are also used.

Under these conditions, as shown in FIGS. 8A1–8A3, a first count A (timing data TD) is obtained. Since the sample signal SCLK is one clock period behind the launch signal LE, the first count A represents one clock period. As a result, the timing per count TPC is given by:

$TPC = B/A$ nS per count where B is the period of the clock signal CLK. For example, if the first count A is 50 and the clock period is 25 nS, then the time per tap TPT is 0.5 nS.

Next, control circuit 114 enters a normal mode to determine a measured data set up time MDT. In the normal mode, the rising edge of the launch signal LE represents a change of state point in the output data signal ODS where data can change from one logic state to another logic state (logic transition point 210). The position of the rising edge of the launch signal with respect to the clock signal CLK varies in response to the magnitude of the supply voltage VDD.

To determine the measured data set up time MDT, circuit 114 generates the rising edge of the launch signal LE in response to an edge of the output data signal ODS, using the highest clock frequency and the worst case voltage and temperature conditions.

Under these conditions, as shown in FIGS. 8B1–8B2, a second count C (timing data TD) is obtained. In this case, the second count C represents the measured data set up time MDT. The measured data set up time MDT represented by the second count is given by:

$MDT = C*(B/A)$ nS.

For example, a count C of 40 multiplied times 0.5 nS per count gives a data set up time of 20 nS.

In a synchronous circuit, the actual worst case delay from when the output data signal ODS leaves RAM 110 to when the output data signal ODS hits the input of the next clocked logic device can be determined from the static timing analysis of a synthesis report.

The slack is the difference between the actual delay as defined by the static timing analysis (based on worst case process, voltage, and temperature), and the available time as defined by the measured data set up time MDT. To squeeze out the slack, control circuit 114 proportionately reduces the value of the second count C to generate a squeezed count CV given by:

$CV = C*(D/MDT) = (D*A)/B$ where D represents the time provided by the static timing analysis. For example, the static timing analysis could indicate that the maximum propagation delay from when the data becomes valid from RAM 110 to when the data from RAM 110 arrives at the next clocked logic block is 10 nS (this typically includes a timing margin). Thus, in this example, the static timing delay is ½ of the measured data set up time MET.

As a result, the count C (40 in this example) is reduced by ½ to form a count value CV of 20. Once the count value CV has been determined, control circuit 114 varies the up signal UP and the down signal DN to change the supply voltage VDD output by power supply 116 until the second count C reaches the count value CV (20 in this example), assuming that data integrity can be maintained at the lower supply voltage.

When the frequency of the clock signal CLK then changes, the change in frequency is again reflected in the count. If the frequency of the clock signal CLK falls to half of its previous value, then the count rises to 40. As described above, the supply voltage VDD is lowered until the count again reaches 20, assuming that data integrity can be maintained at the lower supply voltage.

Thus, the present invention provides a circuit and a method of reducing the supply voltage VDD when the clock frequency is reduced, thereby reducing power consumption. Memory circuit 100 can respond to changes in the frequency of the clock signal, or to changes in the clock signal frequency in addition to squeezing out the timing slack.

FIG. 9A shows a schematic diagram that illustrates a first alternate embodiment of a time slack detector 900 in accordance with the present invention. FIG. 9B shows a timing diagram that illustrates the operation of detector 900 in accordance with the present invention. Detector 900 can be used to implement detector 112.

As shown in FIG. 9A, detector 900 includes a critical path delay circuit 910 that receives the launch signal LE, and outputs a delayed launch signal DLE. Critical path delay circuit 910 models the worst case propagation delay from when the data becomes valid from RAM 110 to when the data from RAM 110 arrives at the next clocked logic block. Circuit 910 can be implemented with, for example, a series of delay cells, such as cell 508, or a replica of the gates that make up the worse case propagation delay.

Detector 900 also includes a pair of delay elements DE1 and DE2 that have a corresponding pair of outputs DT1 and DT2, respectively. The first delay element DE1 is connected to receive the delayed launch signal DLE, while the second delay element DE2 is connected to the first delay element DE1. Each delay element DE has a number of delay cells, such as cell 508.

Detector 900 additionally includes a pair of taps TA1 and TA2 that are connected to the outputs of the first and second delay elements DE1 and DE2, respectively. Taps TA1 and TA2 latch and output the logic states of the delay elements DE1 and DE2 in response to the rising edge of the sample signal SCLK. (By connecting tap TA1 to the output of delay element DE1 rather than the output of critical path delay circuit 910, a timing margin is added.)

In operation, when the supply voltage VDD is set to consume minimum power for the frequency of the clock signal CLK, the rising edge of the launch signal LE input to critical delay path circuit 910 propagates through first delay element DE1, but not through second delay element DE2, before the rising edge of the sample signal SLK latches the logic states.

As a result, tap TA1 latches a logic high from delay element DE1, while tap TA2 latches a logic low from delay element DE2. The 10 logic states latched by taps TA1 and TA2 cause the up signal UP to have a logic low and the down signal DN to have a logic low. When the up signal UP and the down signal DN are both logic zeros, the supply voltage VDD output by power supply 116 remains unchanged.

When the frequency of the clock signal CLK decreases, the rising edge of the launch signal LE passes through both the first and second delay elements DE1 and DE2 before the rising edge of the sample signal SCLK latches the values. The rising edge passes through both the first and second delay elements DE1 and DE2 because the period of the clock signal CLK is now longer.

As a result, tap TA1 latches a logic high from delay element DE1, and tap TA2 latches a logic high from delay element DE2. The 11 logic states latched by taps TA1 and TA2 causes the up signal UP to have a logic low and the down signal DN to have a logic high. Thus, at a lower frequency, more propagation delay is required before taps TA1 and TA2 can again latch the logic 10 states. When the up signal UP is a logic low and the down signal DN is a logic high, power supply 116 decreases the supply voltage VDD until taps TA1 and TA2 can again latch a logic high and a logic low.

When the frequency of the clock signal CLK changes from a low to a high frequency, the rising edge of the launch signal LE fails to make it to first delay element DE1 before the rising edge of the sample signal SCLK latches the logic states. The rising edge does not make it to first delay element DE1 because the period of the clock signal is shorter.

As a result, tap TA1 latches a logic low from first delay element DE1, and flop TA2 latches a logic low from the second delay element DE2. The 00 logic states latched by taps TA1 and TA2 causes the up signal UP to have a logic high and the down signal DN to have a logic low.

At higher frequencies, less propagation delay is required before taps TA1 and TA2 can again latch the logic 10 states. When the up signal UP is a logic high and the down signal DN is a logic low, power supply 116 increases the supply voltage VDD. The propagation delay corresponds with the supply voltage VDD such that when the delay is sufficiently decreased so that taps TA1 and TA2 can again latch a logic high and a logic low, the supply voltage VDD is again set to consume minimum power at the clock frequency.

As further shown in FIG. 9A, delay elements DE1 and DE2 are reset by a signal from an OR gate. The first input of the OR gate is the reset signal RST, while the second input of the OR gate is the output of an AND gate. The first input of the AND is the inverse of the launch signal LE, while the second input is connected to receive the sample signal SCLK. As a result, delay elements DE1 and DE2 are reset each time the launch signal LE is low and the sample signal SCLK is high.

Thus, detector 900 provides a circuit and a method of adjusting the supply voltage VDD to use the minimum supply voltage with a given clock frequency, thereby reducing power consumption. Detector 900 removes slack and responds to changes in the frequency of the clock signal.

FIG. 10A shows a schematic diagram that illustrates a second alternate embodiment of a time slack detector 1000 in accordance with the present invention. FIGS. 10B1–10B4 show timing diagrams that illustrates the operation of detector 1000 in accordance with the present invention. Detector 1000 is similar to detector 900 and, as a result, utilizes the same reference numerals to designate the structures that are common to both detectors.

As shown in FIG. 10A, detector 1000 differs from detector 900 in that detector 1000 includes one additional pair of taps TX1 and TX2. Taps TX1 and TX2 each have a D input that is connected to the Q output of the corresponding pair of taps TA1 and TA2. The clock inputs of taps TA1 and TA2 are connected to receive a first clock signal CK1, while the clock inputs of taps TX1 and TX2 are connected to receive a second clock signal CK2.

As shown in FIGS. 10B1–10B4, taps TA1 and TA2 latch the logic states of delay elements DE1 and DE2 one clock period after the rising edge of the launch signal LE on the rising edge of the first clock signal CK1. Following this, one clock period later, on the rising edge of the second clock signal CK2, taps TX1 and TX2 latch the logic states held by latches TA1 and TA2, respectively.

Detector 1000 can also optionally differ from detector 900 by including a pair of OR gates G0 and G1 where the outputs of the OR gates G0 and G1 are connected to the reset inputs of delay elements DE1 and DE2, respectively. OR gates G0 and G1 allow a pair of test control signals TST0 and TST1, respectively, to be used to test the delay elements.

Figure 11:
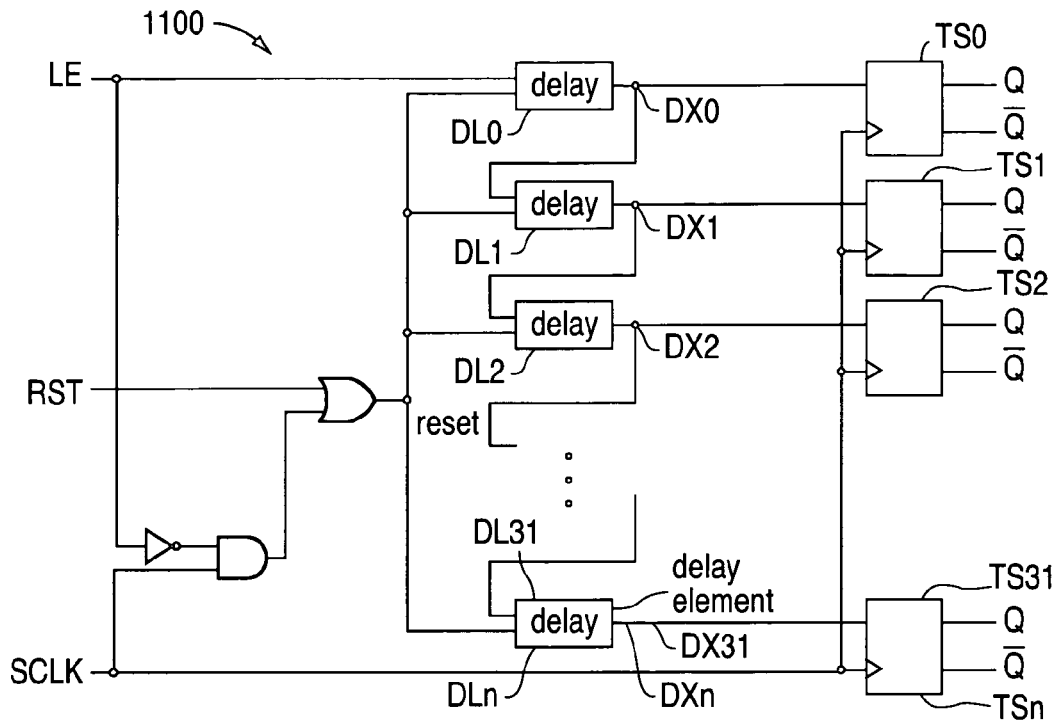
FIG. 11 is a schematic diagram illustrating a time slack detector 1100 in accordance with third alternate embodiment of the present invention.

FIG. 11 shows a schematic diagram that illustrates a time slack detector 1100 in accordance with third alternate embodiment of the present invention. The timing diagrams shown in FIGS. 9B1–9B3 also apply to detector 1100. Detector 1100 can be used to implement detector 112.

As shown in FIG. 11, detector 1100 includes a series of substantially equal delay elements DL0–DLn that have a corresponding series of outputs DX0–DXn. The first delay element DL0 is connected to receive the launch signal LE. Each delay element DL has a number of delay cells, such as cell 508.

In addition, the total delay is set so that under worst case PVT conditions and with the highest frequency clock signal CLK, the launch signal LE will pass through a predetermined number of delay elements DL0–DLn before the next rising edge of the sample signal SCLK.

In the example shown in FIG. 11, detector 1100 has 32 delay elements DL0–DL31 that have 32 corresponding outputs DX0–DX31. In this case, the total delay can be set so that under worst case PVT conditions and with the highest frequency clock signal CLK, the rising edge of the launch signal LE will pass through 16 delay elements DL0–DL15 before the next rising edge of the sample signal SCLK.

Detector 1100 additionally includes a series of taps TS0–TSn that latch and output the logic states and the inverse logic states that are present on the delay element outputs DX in response to the rising edge of the sample signal SCLK.

In the example shown in FIG. 11, detector 1100 has 32 taps TS0–TS31 that latch and output the logic states that are output from delay elements DL0–DL31. The outputs from the series of delay taps TS0–TS31, in turn, form a 32-bit word that represents the data set up time. The use of 32 delay elements and 32 taps is merely exemplary. A greater or lesser number of delay elements and taps can be used, and differing numbers of delay elements and taps can be used.

In operation, the rising edge of the launch signal LE is input to the first delay element DL0 of the series. The edge propagates through each succeeding delay element DL in the series until the rising edge of the sample signal SCLK clocks the taps TS (and resets the delay elements).

For example, assume that the rising edge of the launch signal LE propagates through 16 delay elements before the rising edge of the sample signal SCLK clocks the taps TS and resets the delay elements DL. This causes the first 16 delay elements DL0–DL15 to output a logic high, while the last 16 delay elements DL16–DL31 output a logic low (because the rising edge of the launch signal LE did not propagate any further than delay element DL15).

The first 16 taps TS0–TS15, in turn, latch the logic high output from delay elements DX0–DX15, while the last 16 taps latch the logic low output from delay elements DX16–DX31. Thus, in this example, detector 1100 outputs a 32-bit word with a pattern of 16 highs, followed by 16 lows when the highest clock frequency is used under the worst case PVT conditions.

When the frequency of the clock signal CLK changes, the change in frequency is reflected in the pattern of the 32-bit word. For example, if the frequency of the clock signal CLK falls from 100 MHz to 66.7 MHz (such that the period is longer by 50%), the first 24 taps latch the logic high output from delay elements DL0–DL23 while the last 8 taps latch the logic low output from delay elements DL24–DL31.

Control circuit 114 responds to the change and outputs the down signal DN to lower the supply voltage VDD. As the supply voltage VDD is lowered, the propagation delay falls. The supply voltage VDD is lowered until the edge of the launch signal LE again causes the first 16 taps to latch the logic high output from delay elements DL0–DL15 while the last 16 taps latch a logic low that is output from delay elements DL16–DL31, assuming that data integrity can be maintained at the lower supply voltage. (Similarly, control circuit 114 outputs the up signal UP to raise the supply voltage VDD when the clock frequency is again increased.)

In addition to controlling the magnitude of the supply voltage in response to the frequency of the clock signal, the present invention can also further lower the supply voltage by squeezing out any slack in the timing. To squeeze out the slack, control circuit 114 first determines the number of taps that should have a logic high if the slack is removed, and then varies the supply voltage VDD via the up and down signals UP and DN until the determined number of taps is latched.

To determine the number of taps that should get latched, control circuit 114 first enters a calibration mode to determine a timing per tap TPT. To determine the timing per tap TPT, circuit 114 synchronizes the launch signal LE to the clock signal CLK which, in turn, is set to the highest frequency provided by the application. In addition, worst case voltage and temperature conditions are also used.

Under these conditions, a first 32-bit word (timing data TD) is obtained. Since the sample signal SCLK is one clock period behind the launch signal LE, the first 32-bit word represents one clock period. As a result, the timing per tap TPT is given by:

$$TPT=B/E \text{ nS per tap}$$

where B is the period of the clock signal CLK, and E is the number of logic highs in the first word. For example, if the pattern of the first word is 20 highs followed by 12 lows and the clock period is 20 nS, then the time per tap TPT is 1.0 nS per tap.

Next, control circuit 114 enters a normal mode to determine a measured data set up time MET. To determine the measured data set up time MET, circuit 114 generates the rising edge of the launch signal LE in response to an edge of the output data signal ODS, using the highest clock frequency and the worst case voltage and temperature conditions.

Under these conditions, a second 32-bit word (timing data TD) is obtained. The measured data set up time MET can then be given by:

$$MET=F*(B/E) \text{ nS}$$

where F is the number of logic highs in the second word. For example, if the pattern of the second word is 10 highs followed by 22 lows, the 10 logic highs multiplied times 1.0 nS per tap gives a data set up time of 10 nS.

As further noted above, in a synchronous circuit, the actual worst case delay from when the data output from RAM 110 is valid to when the output data signal ODS hits the input of the next clocked logic device can be determined from the static timing analysis of a synthesis report.

In this case, the slack is the difference between the actual delay as defined by the static timing analysis (based on worst case process, voltage, and temperature conditions), and the available time as defined by the measured data set up time. To squeeze out the slack, control circuit 114 proportionately reduces the value of the second word to generate a squeezed word TV given by:

$$TV=F*(D/MET)=(D*E)/B.$$

For example, the static timing analysis could indicate that the maximum propagation delay from when the data becomes valid from RAM 110 to when the data from RAM 110 arrives at the next clocked logic block is 5 nS (this typically includes a timing margin). Thus, in this example, the static timing delay is ½ of the measured data set up time MET.

As a result, the number of logic highs in the second word (10 in this example) is reduced by ½ to form the tap word TV (5 logic highs followed by 27 logic lows in this example). Once the tap word TV has been determined, control circuit 114 varies the supply voltage VDD via the up signal UP and the down signal DN until the pattern of the second word matches the pattern of the tap word, assuming that data integrity can be maintained at the lower supply voltage.

When the frequency of the clock signal CLK then changes, the change in frequency is again reflected in the pattern of the 32-bit word. In this case, if the frequency of the clock signal CLK falls to a value such that its period is half of its previous value, then the number of logic highs in the second word rises to 10. As described above, the supply voltage VDD is lowered until the number of logic highs in the second word again reaches 5, assuming that data integrity can be maintained at the lower supply voltage. (Similarly, control circuit 114 outputs the up signal UP to raise the supply voltage VDD when the clock frequency is again increased.)

As further shown in FIG. 11A, delay elements DL0–DLn are reset by a signal from an OR gate. The first input of the OR gate is the reset signal RST, while the second input of the OR gate is the output of an AND gate. The first input of the AND is the inverse of the launch signal LE, while the second input is connected to receive the sample signal SCLK. As a result, delay elements DL0 and DLn are reset each time the launch signal LE is low and the sample signal SCLK is high.

Thus, detector 1100 provides a circuit and a method of adjusting the supply voltage VDD to use the minimum supply voltage with a given clock frequency, thereby reducing power consumption. Detector 1100 can respond to only changes in the frequency of the clock signal, or to changes in the frequency of the clock signal in addition to squeezing out slack.

Figure 12:
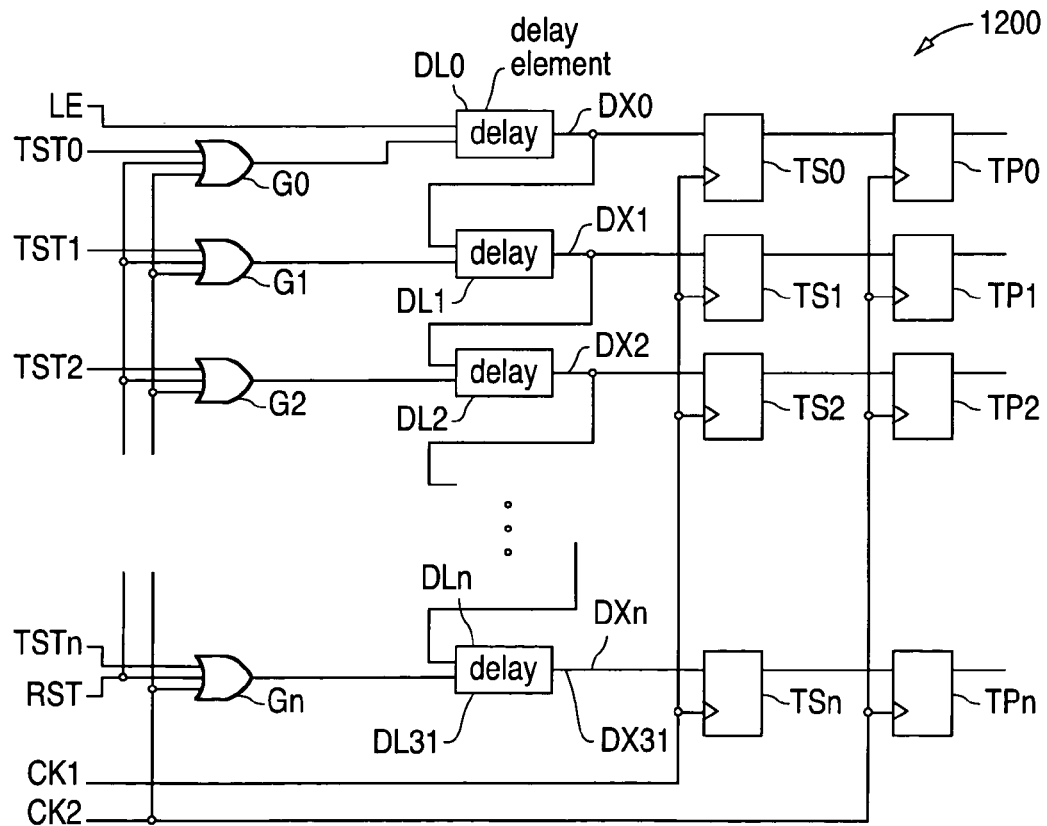
FIG. 12 is a schematic diagram illustrating a time slack detector 1200 in accordance with a fourth alternate embodiment of the present invention.

FIG. 12 shows a schematic diagram that illustrates a time slack detector 1200 in accordance with a fourth alternate embodiment of the present invention. Detector 1200 is similar to detector 1100 and, as a result, utilizes the same reference numerals to designate the structures that are common to both detectors. The timing diagrams shown in FIGS. 10B1–10B4 also apply to detector 1200.

As shown in FIG. 12, detector 1200 differs from detector 1100 in that detector 1200 includes one additional series of taps TP0–TPn. Taps TP0–TPn each have a D input that is connected to the Q output of the corresponding series of taps TS0–TSn. The clock input of taps TS0–TSn and TP0–TPn are connected to receive a first clock signal CK1 and a second clock signal CK2, respectively.

Detector 1200 can also optionally differ from detector 1100 by including a series of OR gates G0–Gn where the outputs of the OR gates G0–Gn are connected to the reset inputs of delay elements DL0–DLn, respectively. OR gates G0–Gn allow a series of test control signals TST0–TSTn to be used to test the delay elements.

In operation, the rising edge of the launch signal LE propagates through the delay elements until the output values are latched by taps TS0–TSn on the rising edge of the first clock signal CK1. On the rising edge of the pulse of the second clock signal CK2, taps TP0–TPn latch the output values latched by taps TS0–TSn.

One of the advantages of detector 1200 over detector 1100 is that detector 1200 reduces metastability that can occur because the launch signal LE and the sample signal SCLK have no fixed timing relationship.

FIGS. 13A–13G show timing diagrams that illustrate the test operation of detectors 1000 and 1200 in accordance with the present invention. As shown in FIGS. 13A–13G, the test control signals TST0–TSTn (only signals TST0–TST2 are shown in FIG. 13) are output at the same time so that each test control signal TST has a longer logic high time than the preceding test control signal TST, e.g., test control signal TST1 is high longer than signal TST0, and test control signal TST2 is high longer than signal TST1.

In operation, when a test control signal TST has a logic high, the rising edge of the launch signal LE is blocked which, in turn, blocks the propagation of the launch signal LE. When test signal TST0 falls on the first falling edge of the launch signal LE, the value of taps TA0–TAn are logic zeros.

When test signal TST1 falls on the second falling edge of the launch signal LE, tap TP0 has a logic high while taps TP1–TPn have logic lows. When test signal TST2 falls on the third falling edge of the launch signal LE, taps TP0 and TP1 have logic highs while taps TP2–TPn have logic lows. Thus, by sequentially blocking the advance of the launch signal LE in each cycle, each element of the delay chain can be tested by control circuit 114.

Figure 14:
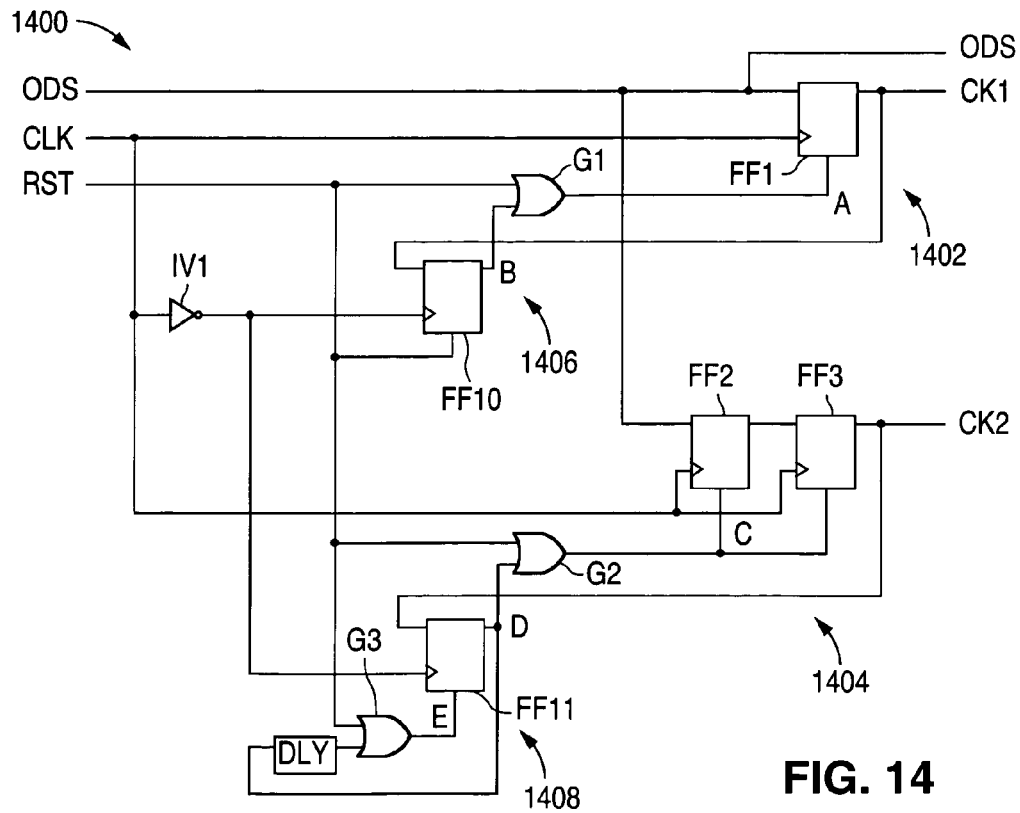
FIG. 14 is a schematic diagram illustrating a timing generation circuit 1400 in accordance with the present invention.

FIG. 14 shows a schematic diagram that illustrates a timing generation circuit 1400 in accordance with the present invention. As shown in FIG. 14, circuit 1400 has an inverter IV1 and two clock generation circuits 1402 and 1404 which produce the first and second clock signals CK1 and CK2, respectively. Circuit 1402 has a D-Q flip flop FF1 that has a D input connected to receive the output data signal ODS, and a clock input to receive the clock signal CLK. In addition, flop FF1 outputs the first clock signal CK1, and resets in response to the signal from a reset circuit 1406.

Reset circuit 1406, in turn, includes a D-Q flip flop FF10 and an OR gate G1. The D input of flop FF10 is connected to receive the first clock signal CK1, while the clock input receives the inverse of the clock signal CLK via inverter IV1. One input of gate G1 is connected to receive the reset signal RST, and the second input is connected to the Q output of flop FF10.

Clock generation circuit 1404 includes D-Q flip flops FF2 and FF3. Flop FF2 has a D input connected to receive the output data signal ODS, and a Q output. Flop FF3 has a D input connected to the Q output of flop FF2, and a Q output that outputs the second clock signal CK2. The clock inputs of flops FF2 and FF3 are connected to the clock signal CLK. Further, flops FF2 and FF3 reset in response to the signal from a reset circuit 1408.

Reset circuit 1408, in turn, includes a D-Q flip flop FF11, a delay DLY, and two NOR gates G2 and G3. The D input of flop FF11 receives the second clock signal CK2, while the clock input is connected to receive the inverse of the clock signal CLK via inverter IV1. The first input of OR gate G2 is connected to the reset signal RST, and the second input is connected to the Q output of flop FF11 and delay DLY. The output of gate G2 is used to reset flops FF2 and FF3. The first input of OR gate G3 is connected to the reset signal RST, and the second input is connected to the output of delay DLY. The output of gate G3 is used to reset flop FF11.

FIGS. 15A–15I show timing diagrams that illustrate the operation of timing generation circuit 1400 in accordance with the present invention. The timing diagram includes the clock signal CLK, the output data signal ODS, the first clock signal CK1, and the second clock signal CK2. In addition, the timing diagram includes the waveforms at nodes A–E (as shown in FIG. 14).

As shown in FIGS. 15A–15I, after reset, when the output data signal ODS transitions to a logic high, a logic high is placed on the D inputs of flop FF1 and FF2. On the rising edge of the next clock signal CLK (less than one period after the rising edge of the output data signal ODS), a CK1 pulse is output by flop FF1. In addition, a logic high is output by flop FF2, placing a logic high on the input of flop FF3. On the next rising edge of the clock signal CLK, a logic high is output by flop FF3 (which is the CK2 pulse).

As shown in FIG. 14, once the first clock signal CK1 has gone high, on the next falling edge of the clock signal CLK, the output of flop FF10 will go high, which then resets flop FF1 to a logic low. As a result, a clock pulse CK1 is generated one clock after the launch edge. As further shown in FIG. 14, once the second clock signal CK2 has gone high, on the next falling edge of the clock signal CLK, the output of flop FF11 will go high, which then resets flops FF2 and FF3. As a result, a clock pulse CK2 is generated one clock after the CK1 pulse.

In addition to the above embodiments, time slack detector 112 can also be implemented as disclosed in application Ser. No. 10/324,997 for "System and Method for Signal Delay in an Adaptive Voltage Scaling Slack Detector" filed on Dec. 18, 2002 by Wai Cheong Chan and Donald Kevin Cameron which is hereby incorporated by reference.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A memory system comprising:
   a memory connected to a supply voltage, the memory having a clock input that receives a clock signal, a data input that receives to-be-stored data, and a data output that outputs a data output signal that outputs stored memory data;
   a time slack detector circuit that receives a sample signal and a launch signal, and outputs timing data defined by the sample and launch signals, the timing data having a first value when the clock signal has a first frequency, and a second value when the clock signal has a second frequency; and a control circuit connected to the memory and the time slack detector circuit, the control circuit generating the launch signal in response to the data output signal, and the sample signal in response to the launch signal, the control circuit detecting a change in the timing data and, in response to the change, outputting a signal that adjusts a magnitude of the supply voltage.

2. The memory system of claim 1 wherein the timing data is a measurement of a time from when data becomes valid on the data output to a next edge of the clock signal.

3. The memory system of claim 2 wherein when the control circuit detects a change in the timing data from the first value to the second value, the control circuit reduces the magnitude of the supply voltage.

4. The memory system of claim 3 wherein the control circuit reduces the magnitude of the supply voltage until the timing data returns to the first value.

5. The memory system of claim 4 wherein when the magnitude of the supply voltage changes, the control circuit outputs an address to the memory, compares data from the address to data known to be stored at the address, and determines if data read from the memory is valid.

6. The memory system of claim 5 wherein when data read from the memory is invalid, the control circuit increases the magnitude of the supply voltage.

7. The memory system of claim 2 wherein when the control circuit detects a change in the timing data from the first value to the second value, the control circuit changes the magnitude of the supply voltage until the timing data returns to the first value.

8. The memory system of claim 7 wherein when the magnitude of the supply voltage changes, the control circuit outputs an address to the memory, compares data from the address to data known to be stored at the address, and determines if data read from the memory is valid.

9. The memory system of claim 8 wherein when data read from the memory is invalid, the control circuit increases the magnitude of the supply voltage.

10. The memory system of claim 2 wherein when the magnitude of the supply voltage changes, the control circuit outputs an address to the memory, compares data from the address to data known to be stored at the address, and determines if data read from the memory is valid.

11. The memory system of claim 10 wherein when data read from the memory is invalid, the control circuit increases the magnitude of the supply voltage.

12. The memory system of claim 1 wherein the time slack detector includes:
a multiplexer having a first input, a second input, and an output;
a delay element having an input connected to the output of the multiplexer, and an output, the delay element outputting pulses; and
a counter that counts the pulses and outputs a count value.

13. The memory system of claim 12 and further comprising:
a pulse shaper connected to the output of the delay element and the second input of the multiplexer, the pulse shaper shaping pulses received from the delay line; and
wherein the counter includes a synchronizer that delays the pulses output from the delay element to form counter pulses, and synchronizes the clock signal and the pulses output from the delay line to output the sample clock signal, the counter counting the counter pulses, and latching a count in response to the sample clock signal.

14. The memory system of claim 12 wherein the timing data measures a time from when data becomes valid on the memory data output to a next edge of the clock signal.

15. The memory system of claim 14 wherein when the control circuit detects a change in the timing data from the first value to the second value, the control circuit changes the magnitude of the supply voltage until the timing data returns to the first value.

16. The memory system of claim 1 wherein the memory is a random access memory.

17. The memory system of claim 1 wherein the time slack detector includes:
a plurality of serially-connected delay elements having a plurality of reset inputs and a plurality of outputs; and
a plurality of first taps connected to the outputs of the delay elements, and having a plurality of first tap outputs, a first plurality of the first tap outputs having a logic high when the clock signal has the first frequency, and a second plurality of the first tap outputs having a logic high when the clock signal has the second frequency.

18. The memory system of claim 17 and further comprising a plurality of second taps connected to the outputs of the plurality of first taps, and having a plurality of second tap outputs, a first plurality of the second tap outputs having a logic high when the clock signal has the first frequency, and a second plurality of the second tap outputs having a logic high when the clock signal has the second frequency.

19. The memory system of claim 18 wherein the plurality of first taps have clocked inputs connected to receive a first clock signal, and the plurality of second taps have clocked inputs that are connected to receive a second clock signal.

20. The memory system of claim 18 and further comprising a logic gate that provides an OR function, the logic gate having an output connected to the reset inputs.

21. The memory system of claim 1 wherein the time slack detector includes:
a critical path delay circuit that receives the launch signal;
a pair of serially-connected delay elements, a first delay element being connected to the critical path delay circuit, each delay element having an output; and
a pair of taps connected to the outputs of the delay elements, and having two or more first tap outputs, the pair of taps being clocked by the sample signal.

22. The memory system of claim 1 wherein the time slack detector includes:
a critical path delay circuit that receives the launch signal;
a pair of serially-connected delay elements, a first delay element being connected to the critical path delay circuit, each delay element having an output;
a pair of first taps connected to the outputs of the delay elements, and having two or more first tap outputs, the pair of taps being clocked by a first clock signal; and
a pair of second taps connected to the outputs of the pair of first taps, and having two or more second tap outputs, the pair of second taps being clocked by a second clock signal.

23. The memory system of claim 21 wherein the control circuit includes:
a first flop connected to receive the output data signal and the clock signal, the first flop outputting the first clock signal; and a generation circuit that has second and third flops, the second flop being connected to receive the output data signal and the clock signal, the third flop being connected to an output of the second flop, and outputting the second clock signal.

24. The memory system of claim 1 wherein the control circuit determines a timing value that should be output as timing data if slack is removed, and then varies the supply voltage VDD until the first value matches the timing value.

25. The memory system of claim 24 wherein the control circuit:
- determines timing information that represents a data set up time;
- determines a data set up time;
- determines a propagation delay;
- divides the propagation delay by the data set up time to define a result; and
- multiplies the result times the timing information to determine the timing value.

26. The memory system of claim 24 wherein the control circuit:
- determines timing information that represents one clock cycle;
- determines a propagation delay;
- multiplies the propagation delay times the timing information to form a result; and
- divides the result by a clock period to determine the timing value.

27. The memory system of claim 1 wherein the time slack detector includes:
- a resetable delay loop having a launch edge input and a first reset input; and
- a resettable counter/latch circuit having a second reset input, an output, an input coupled to an output of the resetable delay loop, and a sample edge input.

28. The memory system of claim 1 and further comprising a memory device connected to the supply voltage, the memory having a performance, the memory device having a performance equal to or better than the memory.

29. A method of adjusting a magnitude of a supply voltage provided to a circuit, the circuit having a memory, the memory having a memory clock input that receives a clock signal, a data input that receives to-be-stored data, a supply voltage input, and a memory data output that outputs memory data, the method comprising:
- outputting a timing value, the timing value having a first value when the clock signal has a first frequency, and a second value when the clock signal has a second frequency, the timing value representing a time measured from when data becomes valid on the memory data output to a next edge of the clock signal;
- detecting a change in the timing value; and
- outputting a signal that adjusts a magnitude of the supply voltage in response to the change.

* * * * *